United States Patent
Hoeweler et al.

(10) Patent No.: US 6,564,350 B1
(45) Date of Patent: May 13, 2003

(54) TESTING FREQUENCY HOPPING DEVICES

(75) Inventors: David J. Hoeweler, Cambridge, MA (US); Michael A. Rothman, Boston, MA (US)

(73) Assignee: Teradyne, Inc., Boston, MA (US)

( * ) Notice: Subject to any disclaimer, the term of this patent is extended or adjusted under 35 U.S.C. 154(b) by 460 days.

(21) Appl. No.: 09/608,040

(22) Filed: Jun. 30, 2000

(51) Int. Cl.[7] .......................... G01R 31/28; G01R 1/24; H04B 17/00

(52) U.S. Cl. ...................... 714/742; 714/724; 455/67.4; 370/252; 375/132; 375/138; 343/703

(58) Field of Search ................................. 714/724, 742; 702/123; 717/109; 455/67.1, 67.4, 67.3, 62, 115, 423, 425, 436; 375/132, 135, 138; 370/249, 252, 321, 337; 342/189, 192; 343/703

(56) References Cited

U.S. PATENT DOCUMENTS

| | | | |
|---|---|---|---|
| 4,894,829 A | * | 1/1990 | Monie et al. ................ 714/712 |
| 5,521,904 A | * | 5/1996 | Eriksson et al. ............ 370/249 |
| 6,148,020 A | * | 11/2000 | Emi ........................... 375/132 |
| 6,233,437 B1 | * | 5/2001 | Klenner ...................... 455/115 |
| 6,236,371 B1 | * | 5/2001 | Beck ........................... 343/703 |
| 6,275,518 B1 | * | 8/2001 | Takahashi et al. ........... 375/135 |

* cited by examiner

Primary Examiner—Emmanuel L. Moise
(74) Attorney, Agent, or Firm—Bruce D. Rubenstein (57) ABSTRACT

An improved system and method for testing high frequency electronic devices. The improvement allows characteristics such as phase noise to be measured while a device under test changes operating frequency (frequency hops) at its normal rate. In accordance with the invention, a dynamic controller programs the frequencies of first and second frequency synthesizers at precisely controlled instants of time. For each of the first and second synthesizers, the dynamic controller includes a frequency memory for storing a sequence of frequency data, a counter for sequencing through the frequency memory, and a timing source for activating the counter. Data stored at each location of the frequency memory represents a frequency to which the respective synthesizer is to be programmed. The output from the first synthesizer is provided to the input of a device under test (DUT), in response to which the DUT generates and output signal. A mixer receives at its inputs the output of the DUT and the output of the second synthesizer. The mixer combines the two inputs to generate a test signal. The test signal can then be digitized, and the resulting digital samples can be evaluated. Under control of the timing source, the dynamic controller steps through different addresses of the frequency memories for the first and second synthesizers. At each memory location, new data are sent to the synthesizers at precisely controlled instants of time. New frequencies are established, and the test signal is again digitized. Characteristics of the DUT can be determined from the digital samples at each frequency that the DUT assumes.

20 Claims, 4 Drawing Sheets

|    | AWG   | SYNTH 1 | SYNTH 2 | DIG     |
|----|-------|---------|---------|---------|
| 0  | START | START   | START   |         |
| 1  |       |         |         | CAPTURE |
| 2  |       |         |         |         |
| 3  |       |         |         |         |
| 4  |       |         |         |         |
| 5  |       | HOP     | HOP     | STOP    |
| 6  |       |         |         | CAPTURE |
| 7  |       |         |         |         |
| 8  |       |         |         |         |
| 9  |       |         |         |         |
| 10 |       | HOP     | HOP     | STOP    |
| 11 |       |         |         | CAPTURE |
| 12 |       |         |         |         |
| 13 |       |         |         |         |
| 14 |       |         |         |         |
| 15 | STOP  |         |         | STOP    |

TESTING FREQUENCY HOPPING DEVICES

This invention relates generally to automatic test equipment, and more particularly to using automatic test equipment to test RF and microwave devices that rapidly switch between different operating frequencies.

BACKGROUND OF THE INVENTION

Manufacturers of RF and microwave integrated circuits frequently use automatic test equipment (ATE) to verify newly manufactured devices. Testing devices early in the manufacturing process generally reduces manufacturing costs. Therefore, manufacturers preferably test integrated circuits prior to packaging the devices or attaching leads.

Oftentimes, manufacturers categorize integrated circuits based upon tested performance. The more accurately ATE systems can test integrated circuits, the more accurately manufacturers can grade devices across different levels of performance. As manufacturers generally receive higher prices for better-performing chips, accurate testing often leads to increased profits.

Figure 1:
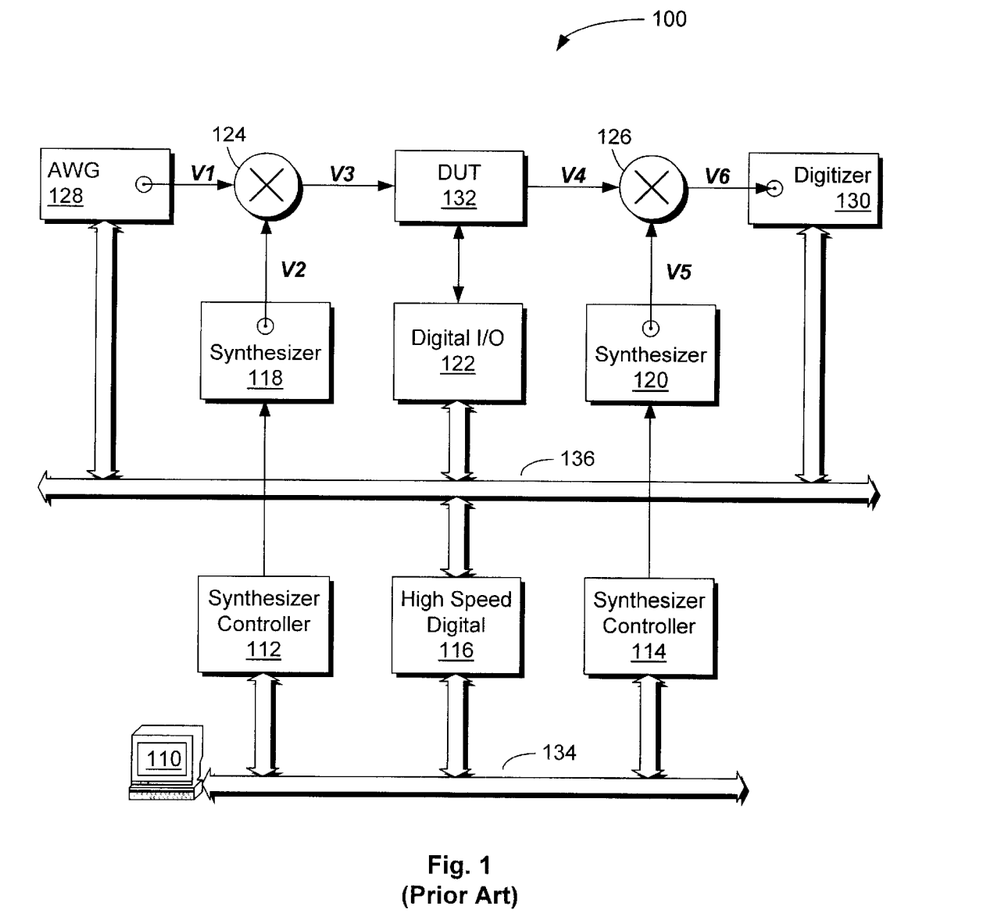
FIG. 1 is a partial block diagram of an ATE system for testing high-frequency devices according to the prior art.

FIG. 1 is a simplified illustration of a conventional ATE configuration for testing RF and microwave integrated circuits. As shown in FIG. 1, an RF DUT (device under test) 132 is connected to a test system 100, such as the Catalyst™ test system from Teradyne, Inc., of Boston, Mass. The DUT 132 receives an RF input signal V3 and generates an RF output signal V4. The DUT 132 also receives signals for communicating with the test system 100 via digital I/O 122.

The input signal V3 of the DUT 132 includes a modulation signal V1 and a high frequency carrier signal V2. The modulation signal V1 generally includes a separate, low frequency carrier signal in addition to low frequency modulation components. A signal source, such as an arbitrary waveform generator (AWG) 128, produces the modulation signal V1. An RF source, such as a high-frequency synthesizer 118, produces the high frequency carrier signal V2. A mixer 124 combines the modulation signal V1 and the high frequency carrier signal V2 to produce the DUT input signal V3. Owing to the operation of the mixer 124, the input signal V3 to the DUT 132 includes frequency components that correspond to the sum and difference of the frequency components that constitute the signals V1 and V2. Optionally, a low pass filter is provided at the output of the mixer 124, to filter the components that correspond to the difference in frequencies of the signals V1 and V2.

In response to the input signal V3, the DUT 132 generates an output signal V4 . . . . To measure the output signal V4, the automatic test system 100 employs a second high-frequency synthesizer 120 and a second mixer 126. The second mixer 126 combines the output signal V4 with the output of the second synthesizer 120 (V5) to produce a test signal V6. The test signal V6 includes frequency components that correspond to the sum and difference of the frequencies of the signals V4 and V5. A low pass filter (not shown) is generally provided at the output of the second mixer 126 to filter the frequency components that correspond to the sum of the frequencies of the signals V4 and V5 A high-speed digitizer 130 measures the frequency components that correspond to the difference of the signals by sampling the signal test V6. Operating on the sampled data, the test system 100 performs one or more digital signal processing (DSP) algorithms to characterize the DUT 132. These algorithms may include a test for phase noise of the DUT 132.

To test phase noise, the test system 100 performs a Fast Fourier Transform (FFT) on the samples acquired from the high-speed digitizer 130. Noise components are identified in the resulting power spectrum, and the level of each noise component is measured. The levels of the noise components are then compared with one or more predetermined thresholds. The DUT generally passes the test if the noise levels are below the threshold(s). Otherwise, the DUT generally fails the test.

As shown in FIG. 1, the test system 100 also includes a high-speed digital subsystem 116 (HSD). The HSD 116 receives instructions from the host computer 110 via a computer bus 134. In response to these instructions, the HSD generates accurately timed commands. The HSD 116 conveys these commands, via a timing bus 136, to the Digital I/O 122, the AWG 128, and the digitizer 130. These portions of the test system 100 are constructed to rapidly respond to the commands from the HSD 116. Therefore, the HSD 116 can accurately coordinate events that take place in these portions of the test system 200.

Many commercial devices are available that change their carrier frequencies (i.e., "frequency hop") at predetermined, regular intervals. For example, certain devices that conform to the "Blue Tooth" communication standard can be made to change their carrier frequency once every 625 microseconds.

We have recognized that the testing arrangement of FIG. 1 cannot accurately measure the characteristics of these Blue Tooth devices as they frequency hop at their specified rate. As shown in FIG. 1, the synthesizers 118 and 120 of FIG. 1 are programmed by a host computer 110. We have recognized commands from the host computer 110 suffer from timing irregularities, which manifest themselves in timing irregularities in programming the synthesizers. We have found that these irregularities are significant and unpredictable.

The timing irregularities of commands from the host computer 110 generally preclude ATE systems from accurately testing Blue Tooth devices as they are being frequency hopped. For certain tests, it may be possible to momentarily interrupt frequency hopping to test these devices at individual operating frequencies. It is believed, however, that doing so for all tests would negatively impact testing accuracy, because it would subject the DUT to conditions that differ significantly from the DUT's normal operating conditions.

What is needed, therefore, is a test system that is capable of testing RF and microwave devices accurately, as the devices are being frequency-hopped at their normal rates.

SUMMARY OF THE INVENTION

With the foregoing background in mind, it is an object of the invention to test frequency-hopping devices, as the operating frequencies of the devices are varied at their normal frequency-hopping rates.

It is another object of the invention to test frequency-hopping devices without being negatively impacted by the timing irregularities of commands from the host computer.

To achieve the foregoing object and other objectives and advantages, a test system for testing a device under test (DUT) includes first and second high-frequency synthesizers, a mixer, and a dynamic controller. The output of the first synthesizer is coupled to the input of the DUT. The mixer combines the output of the DUT with the output of the second synthesizer to generate a test signal, which the test system can then measure. In response to the dynamic controller, the first and second synthesizers are caused to change their output frequencies in synchronization, at tightly controlled instants in time. As the frequencies of the synthesizers are varied from frequency to frequency, the test system measures the test signal at each frequency. The test system then compares the measurements of the test signal with predetermined limits to determine whether the DUT passes or fails.

Additional objects, advantages, and novel features of the invention will become apparent from a consideration of the ensuing description and drawings.

BRIEF DESCRIPTION OF THE DRAWINGS

The invention will be better understood with reference to the accompanying drawings, in which aspects of the prior art and the invention are illustrated as follows.

DESCRIPTION OF THE PREFERRED EMBODIMENT

Topology

Figure 2:
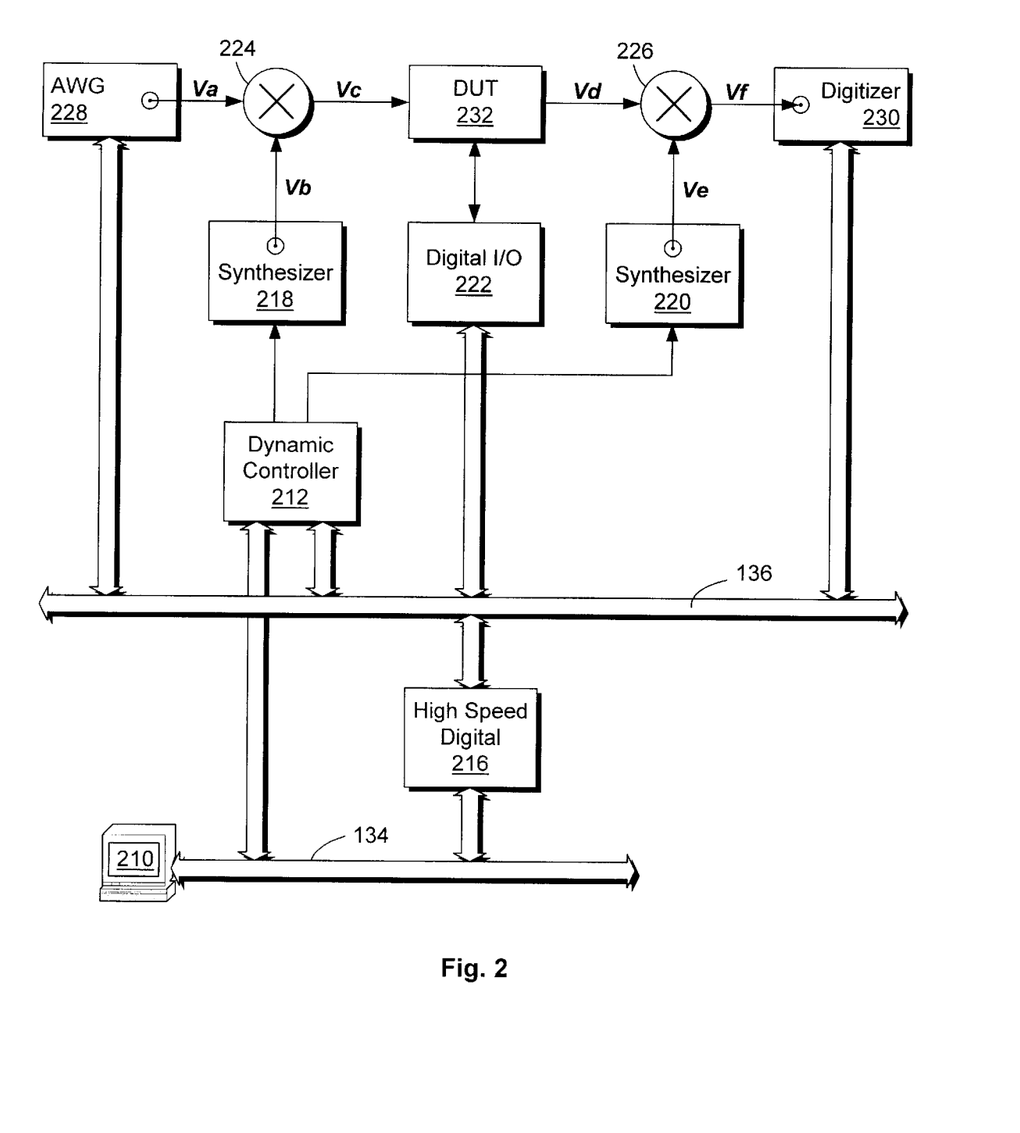
FIG. 2 is a partial block diagram of an ATE system for testing frequency-hopping components according to an embodiment of the invention.

FIG. 2 is a simplified illustration of an ATE system 200 according to the invention for testing RF and microwave components at their normal frequency hopping rates. As shown in FIG. 2, the ATE system 200 includes several elements that are functionally similar to elements pictured in FIG. 1. For example, the ATE system includes first and second synthesizers 218 and 220, first and second mixers 224 and 226, an AWG 228, a digitizer 230, a host computer 210, and an HSD subsystem 216. These elements correspond, respectively, to the elements 118, 120, 124, 126, 128, 130, 110, and 116 pictured in FIG. 1.

In contrast with the ATE system 100 of FIG. 1, the test system 200 provides a dynamic controller 212 in place of the synthesizer controllers 112 and 114. The dynamic controller 212 is coupled to the timing bus 136 for receiving accurately timed commands. In response to these commands, the dynamic controller 212 instructs the first and second synthesizers 218 and 220 to change their operating frequencies at precisely controlled instants in time. Because the first and second synthesizers respond to the dynamic controller 212 instead of responding directly to the host computer 210, the synthesizers 218 and 220 are not subject to the timing irregularities of the host computer 210.

In a typical testing scenario, the dynamic controller activates the first and second synthesizers 218 and 220 to change their output frequencies once per period of a frequency-hopping interval. Therefore, for testing the Blue Tooth devices described above, the dynamic controller 212 changes the frequencies of the synthesizers once every 625 microseconds. By assuring that both synthesizers are activated within each frequency-hopping interval, the test system 200 can measure the output signal of a DUT 232 at each operating frequency that the DUT assumes, while the DUT is frequency hopped at its normal rate.

Dynamic Controller

Figure 3:
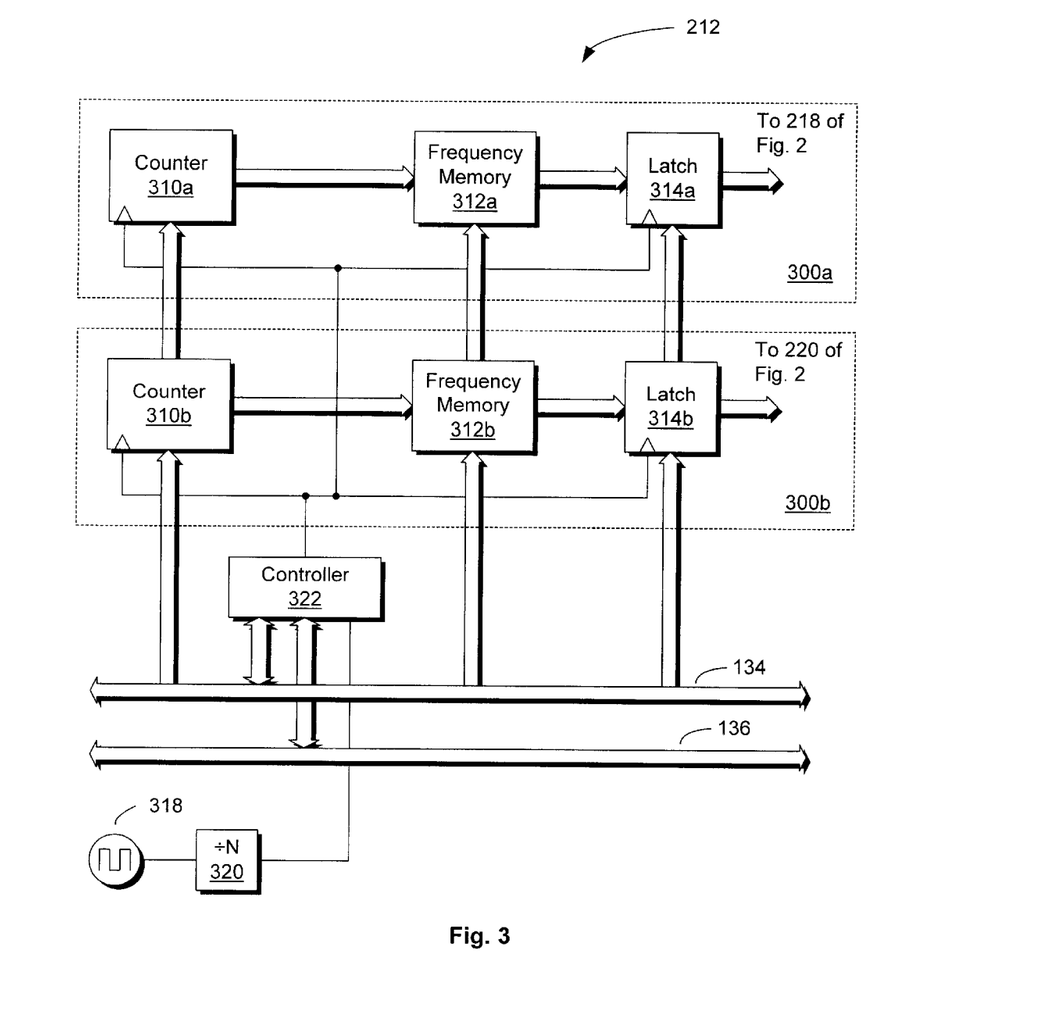
FIG. 3 is a partial block diagram of the constituents of the dynamic controller of FIG. 2.

FIG. 3 is a detailed block diagram of the dynamic controller 212. As shown in FIG. 3, the dynamic controller 212 includes portions 300a and 300b. Portion 300a is dedicated to the first synthesizer 218, and portion 300b is dedicated to the second synthesizer 300b. The dynamic controller 212 also includes a portion that is common to all synthesizers. The dedicated portion 300a for the first synthesizer includes a counter 310a, a frequency memory 312a, and a latch 314a. The frequency memory 312a stores a sequence of frequency data for programming the synthesizer 218. The output of the frequency memory 312a is coupled to the input of the latch 314a. The output of the latch is coupled to a programming input (not shown) of the synthesizer 218.

To operate the dynamic controller 212, the latch 314a is clocked, and the frequency data stored in the frequency memory 312a at the address indicated by the counter 310a is released to the synthesizer 218. The synthesizer then responds by assuming the output frequency designated by the frequency data. An analogous process takes place for programming the second synthesizer 220 via the second dedicated portion 300b.

In general, each counter (310a or 310b) is set to a start address before a frequency hopping sequence is begun. A stop address is also established for each synthesizer, for storing an address in the respective frequency memory at which a frequency hopping sequence is to end. The stop address is preferably stored in a separate stop address register (not shown).

The dynamic controller 212 preferably includes a control circuit 322. The control circuit 322 receives instructions from the host computer 210. It also receives commands from the HSD 216. In response to these instructions and commands, the control circuit 322 directs the activities of the dynamic controller 212. For example, the control circuit 322 provides a clock signal for clocking the counters (310a, 310b) and latches (314a, 314b). The clock signal is derived from one of three sources: (1) the host computer 210 via the computer bus 134; (2) the HSD 216 via the timing bus 136; and (3) a system clock 318. The system clock of the Catalyst™ test system is programmable over a wide range of frequencies. A frequency divider 320 is preferably coupled in series with the output of the system clock 318, for providing even lower clocking frequencies than the system clock 118 can provide alone.

The dynamic controller 212 is preferably implemented within a single FPGA (Field-Programmable Gate Array). Alternatively, it can be implemented across multiple FPGAs, or within one or more ASICs (Application-Specific Integrated Circuits). The dynamic controller 212 could also be manufactured using discrete digital devices.

Operating Modes

The dynamic controller 212 has one programming mode and three operating modes. In programming mode, the host computer 210 loads frequency data for the synthesizers 218 and 220 into the frequency memories 312a and 312b via the computer bus 134. The host computer 210 also programs each of the counters 310a and 310b with a start address and programs each of the respective stop address registers with a stop address.

Once the dynamic controller 212 has been programmed, it may assume the first operating mode. The first operating mode is also called "vector hopping" mode. In vector hopping mode, the dynamic controller 212 receives commands from the HSD 216 via the timing bus 136, for updating the synthesizers 218 and 220 in synchronization with the test vectors.

As is known, "test vectors" are units of time during which a tester generates coordinated events, such as driver edges, detector windows, or other events. A test vector begins at a particular instant, generally called "T0," lasts for a particular interval, and can repeat at a predetermined frequency.

Test vectors can be made to simultaneously control multiple resources within a tester. As is known, test vectors in the Catalyst™ test system can control the AWG 228, the digital I/O 222, and the digitizer 230. For example, a "START" command issued to the AWG 228 within a test vector causes the AWG to generate voltages that correspond to pre-loaded values stored in the AWG's memory. The AWG outputs the voltages at a predetermined sampling rate.

In accordance with the invention, test vectors can also be used to control the synthesizers 218 and 220 via the dynamic controller 212. The HSD 216 controls the synthesizers 218 and 220 in vector hopping mode using the following commands:

START
HOP

Included within each of these commands is a designation that identifies either the first synthesizer 218 or the second synthesizer 220. When the HSD 216 issues a START command directed to the first synthesizer 218, the control circuit 322 sets the counter 310a to the start address that was specified in programming mode. The control circuit 322 also activates the latch 314a, to capture the frequency data stored in the frequency memory 312a at the address indicated by the counter 310a. The frequency data then propagates to the first synthesizer 218, whereupon the synthesizer changes its frequency to the value prescribed by the frequency data.

A HOP command addressed to the first synthesizer 218 during a subsequent test vector causes the counter 310a to increment, so that the counter points to the next entry in the frequency memory 312a. It also causes the latch 314a to capture the new frequency data. The new frequency data then propagates to the synthesizer 218, causing it to change its operating frequency. Additional HOP commands can be provided within subsequent test vectors, to hop the synthesizer to frequencies specified in other locations of the frequency memory 312a.

In the example above, the START and STOP instructions are directed to the first synthesizer 218. However, these instructions may also be directed to the second synthesizer 220. Within any given test vector, a command may be issued for controlling either synthesizer, or both synthesizers, to change their respective output frequencies.

The second operating mode is called "automatic" mode. In automatic mode, a clock signal (or a divided version of the clock signal) from the system clock 318 activates the counter and latch of a designated synthesizer (identified by a command from the HSD 216). In response to the clock signal, the counter for the designated synthesizer sequences through the corresponding frequency memory in synchronization with the clock signal. The sequence of frequency data is output to the designated synthesizer, whereupon the designated synthesizer assumes frequencies defined by the frequency data.

Automatic mode is also preferably controlled by commands from the HSD 216. Prior to operating in automatic mode, the start and stop addresses for the synthesizers are established, and the frequency memories are loaded with frequency hopping sequences. The following HSD commands are then available for controlling the synthesizers in automatic mode:

START
STOP
START1
STOPE

Each of these commands also includes a designation that identifies either the first synthesizer 218 or the second synthesizer 220. A START command issued in automatic mode enables the clock signal to activate the counter and latch for a designated synthesizer. There is no HOP command. Once a frequency hopping sequence is enabled via a START command, the sequence proceeds automatically, and the designated synthesizer hops in synchronization with the system clock 318. A sequence begun with a START command repeats indefinitely, stopping only when a command is received that stops the sequence.

A subsequent STOP command disables the clock signal and therefore stops frequency hopping. In response to a STOP instruction, the output frequency of the designated synthesizer is maintained indefinitely, until another instruction is received that changes the frequency.

The START1 command is a variation of the START command. The START1 command enables frequency hopping in synchronization with the clock signal for a single pass through the stored frequency data. Frequency hopping automatically stops when the stored sequence reaches its end (i.e., when it reaches the stop address). No STOP command is needed to terminate a frequency hopping sequence that is begun with a START1 command.

The STOPE command is a variation on the STOP command. Rather than causing frequency hopping to stop immediately, the STOPE command causes frequency hopping to stop automatically when the end of a stored sequence of frequency data is reached.

Frequency hopping in automatic mode is unaffected by timing irregularities of the host computer 210. The system clock 318 and divider 320 determine intervals between synthesizer updates. The intervals are unrelated to the host computer's timing.

The dynamic controller 212 can also be operated in a third mode called "compatibility" mode. Compatibility mode enables the dynamic controller to behave like the synthesizer controllers 112 and 114 of FIG. 1. In compatibility mode, the dynamic controller 212 receives commands directly from the host computer 210, for programming a designated synthesizer to a particular output frequency. In response, the control circuit 322 directly programs the latch of the designated synthesizer, causing the synthesizer to assume a desired output frequency prescribed by the command. The counters and frequency memories are not used in compatibility mode. Because the synthesizers are programmed directly by the host computer 210, frequency changes made with compatibility mode suffer from the same timing irregularities as in the configuration of FIG. 1.

Measuring Phase Noise

Figure 4:
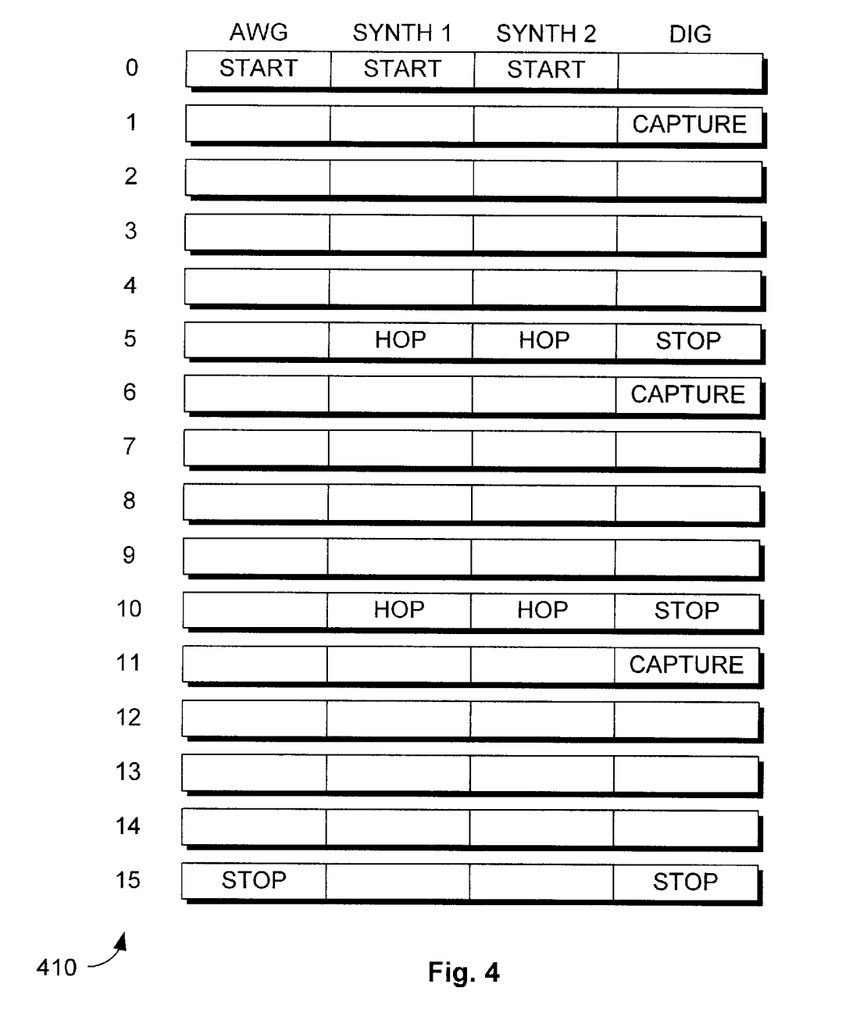
FIG. 4 is a simplified diagram of commands used for controlling portions of the test system of FIG. 2, for measuring phase noise of a device under test.

FIG. 4 illustrates a sequence of commands for measuring the phase noise of a DUT 232 as the DUT is frequency-hopped at its normal rate. Sixteen different test vectors 410, numbered 0–15, are shown in FIG. 4, for controlling the AWG 228, the first and second synthesizers 218 and 220, and the digitizer 230.

As is known, the "vector period" defines the time between successive test vectors generated by the HSD 216. The vector period can be programmed over a range of time that spans several orders of magnitude.

Prior to issuing any test vectors, the AWG 228 is loaded with a predefined waveform, generally a sine wave. The frequency memories 312a and 312b are loaded with respective sequences of frequency data, and the start and stop addresses are loaded into their respective registers (see programming mode, above). The vector period is preferably set to 125 microseconds, precisely one-fifth the Blue Tooth frequency hopping interval mentioned above.

At test vector #0 of FIG. 4, the HSD 216 sends a START command to the AWG 228. In response, the AWG 228 outputs its predefined waveform, and repeats that waveform indefinitely. The waveform from the AWG 228 constitutes the modulation waveform Va of FIG. 2. At test vector #0, the HSD 216 also sends a START command to the first synthesizer 218. It also sends a START command to the second synthesizer 220. In response to these commands, the synthesizer controller 212 activates the latches 314a and 314b, causing them to output the frequency data stored at the start addresses of the corresponding frequency memories. The first and second synthesizers 218 and 220 then generate output signals having frequencies determined by the respective frequency data. The output signal from the first synthesizer 218 constitutes the carrier signal Vb of FIG. 2. The output signal from the second synthesizer 220 constitutes the signal Ve of FIG. 2

Upon completion of test vector #0, the AWG 228 outputs the modulation signal Va, and the first synthesizer 218 outputs the carrier signal Vb. The modulation signal Va generally includes a low frequency carrier signal in addition to modulation components. The mixer 224 has combined the signals Va and Vb to generate the signal Vc. Vc includes frequency components that correspond to the sum and difference of the frequencies present in the signals Va and Vb. Vc has propagated to the input of the DUT 232, and the DUT has responded based upon its inherent characteristics. The DUT's response includes generating an output signal Vd, which generally includes the frequency components present in the DUT input signal Vc. The output signal Vd also includes noise introduced by the DUT 232 itself.

Also upon completion of test vector #0, the output signal Vd of the DUT 232 mixes (via the mixer 226) with the signal Ve, from the second synthesizer 220, to generate a test signal Vf. The test signal Vf includes frequency components that correspond to the sum and difference of the frequencies present in the signals Vd and Ve. The components that correspond to the sum of frequencies are filtered. However, the components that correspond to the difference of frequencies are measured by the digitizer 230.

At the start of test vector #1, precisely 125 microseconds after the start of vector #0, the HSD 216 issues a CAPTURE command to the digitizer 230. In response, the digitizer begins sampling the test signal Vf and storing the sampled results. The sampling rate of the digitizer 230 is preferably high enough to capture all desired frequency components of the test signal Vf. These components include components from the high frequency signals Vb and Ve, the components present in the modulation signal Va, and noise introduced by the DUT 232.

No commands are issued during test vectors #2–4. During these vectors, the digitizer 230 continues to capture samples from the test signal Vf and to store the samples.

At test vector #5, precisely 625 microseconds after the synthesizers receive the first START commands, both synthesizers 218 and 220 receive HOP commands. At the same time, the digitizer 230 receives a STOP command, which instructs the digitizer to stop capturing data. Upon receiving the HOP commands, the synthesizers 218 and 220 are each caused to.change to the next frequency defined in their respective memories 312a and 312b. Consequently, the carrier signal Vb and the signal Ve change to new frequencies. The synthesizers settle, the DUT 232 stabilizes, and the output signal Vd from the DUT manifests frequency components corresponding to the new carrier signal Vb.

At test vector #6, the HSD 116 issues another CAPTURE command to the digitizer 230, whereupon the digitizer again captures and stores samples of the test signal Vf. The process of hopping the synthesizers and capturing data is repeated at test vectors #10–11. The process is terminated at vector #15. In this example, the frequencies of the synthesizers are hopped twice. Frequency hopping could go on indefinitely. In practicality, however, the number of frequency hops is limited by the amount of memory available in the frequency memories 312a and 312b, and by the amount of memory available in the digitizer 230.

When the frequency hopping sequence is completed, the host computer 210 reads the samples stored by the digitizer 230 and measures the phase noise at each carrier frequency. Generally, measuring phase noise entails computing a separate FFT for each carrier frequency defined in the frequency hopping sequence. For each FFT, the host computer 210 measures the noise components, and compares the noise components with predetermined thresholds. If the noise components are less than the thresholds, the test for phase noise is generally made to pass. Otherwise, the test is generally made to fail.

Alternatives

Having described one embodiment, numerous alternative embodiments or variations can be made.

In the example above, the dynamic controller 212 has two dedicated portions 300a and 300b for controlling two synthesizers. It should be understood, however, that the dynamic controller 212 could be equipped with additional dedicated portions for controlling additional synthesizers. Preferably, the dynamic controller has dedicated portions for supporting the simultaneous control of six different synthesizers.

In the example above, a separate dedicated portion 300a and 300b is provided for each synthesizer to be controlled. It should be understood, however, that these dedicated portions can be combined into one portion, while retaining independent control over different synthesizers. For example, one frequency memory could be provided for all synthesizers, in which each memory location is divided into different sections. Each section would then specify the frequency for a different synthesizer.

In the example described in connection with FIG. 4 above, both synthesizers were made to change their frequencies simultaneously during a frequency-hopping sequence. However, this is merely an example. Different synthesizers can be activated during different test vectors, provided that test data is captured by the digitizer after both synthesizers have stabilized.

In the example above, an AWG produces a modulation waveform that combines with a carrier waveform to provide an input signal to the DUT 232. According to an alternative technique, however, the AWG is omitted and no modulation signal is provided. Moreover, if a modulation signal is used, it need not be a sine wave, as was the modulation signal described above. Rather, the modulation signal can be varied significantly to accomplish a variety of different testing goals.

In the above example, the counters 310a and 310b were used both to sequence through the frequency memory and to store a start address at which a frequency hopping sequence begins. Alternatively, a separate start address register could be provided—distinct from the counter—for storing the start address. When a frequency hopping sequence is begun, the contents of the start address register could be loaded into the counter, whereupon the counter would begin sequencing through the corresponding frequency memory.

In the example above, the frequencies of the synthesizers are hopped at a constant rate of 625 microseconds, in accordance with to the above-mentioned Blue Tooth standard. It should be understood, however, that the frequency hopping rate can assume a wide range of values, provided that the synthesizers are allowed adequate time to settle. In addition, variable rate frequency hopping can be accomplished in vector hopping mode by varying the vector period.

As described above, the high-speed digital subsystem (HSD 216) of the Catalyst™ test system was used to provide commands to different portions of the test system 200 in vector hopping mode. It should be understood, however, that the HSD 216 is merely one example of a digital subsystem that can be used in accordance with the invention. A variety of different digital subsystems are commercially available with different test systems, which can be made to perform substantially the same function as is performed by the HSD described above, with only minor adaptations. Moreover, the invention should not be construed as limited to the Catalyst™ or any other test system.

In addition, the example provided above described a digitizer 230 for sampling the output of the DUT (via the mixer 226). However, a digitizer is merely one type of measurement instrument that may be used in accordance with the invention. Other types of measurement instruments could be used as well, depending upon the particular testing goals.

Moreover, the example described above focuses on measuring the phase noise of a device under test. It should be understood, however, that phase noise is just one of many types of tests that can be performed using the invention. For example, the test system 200 can be used for verifying that data is correctly transmitted through the DUT 232 at different carrier frequencies. According to this variation, the AWG 228 generates data signals, and the mixer 224 modulates the data signals onto different carrier frequencies generated by the first synthesizer 218. The digitizer 230 (via the mixer 226 and second frequency synthesizer 220) captures the output of the DUT at each of the different carrier frequencies, and the test system verifies that the DUT has correctly conveyed the modulated data from input to output. Using vector hopping mode, the DUT can be tested in this manner while it is being frequency hopped at its normal operating rate.

From the foregoing, it should be apparent that these alternatives are illustrative of ways in which the preferred embodiment can be varied within the scope of the invention. Those skilled in the art could readily formulate other variations, without departing from the spirit and scope of the invention. The invention should not be strictly limited to the foregoing description, therefore, but rather interpreted in view of the ensuing claims.

What is claimed is:

1. An automatic test system for measuring electrical characteristics of a DUT (device under test) having an input and an output, as the operating frequency of the DUT varies from one frequency to another, comprising:
   a first frequency synthesizer having a programming input and an output coupled to the input of the DUT;
   a second frequency synthesizer having a programming input and an output;
   a mixer having a first input coupled to the output of the DUT, a second input coupled to the output of the second synthesizer, and an output generating a test signal;
   a timing source for generating timing signals at precisely controlled instants in time; and
   a dynamic controller having a first output coupled to the programming input of the first synthesizer, a second output coupled to the programming input of the second synthesizer, and an input coupled to the timing source for receiving the timing signals, the dynamic controller programming the first and second synthesizers to change frequency at precisely controlled instants in time defined by the timing source.

2. The automatic test system as recited in claim 1, further comprising a measurement instrument coupled to the output of the mixer for measuring the test signal.

3. The automatic test system as recited in claim 2, further comprising:
   a second mixer disposed between the first synthesizer and the DUT, the second mixer having a first input, a second input, and an output, the first input of the second mixer coupled to the output of the first synthesizer and the output of the second mixer coupled to the input of the DUT; and
   an arbitrary waveform generator having an output coupled to the second input of the mixer.

4. The automatic test system as recited in claim 1, wherein the dynamic controller comprises:
   at least one frequency memory for storing at least one sequence of frequency data, the sequence of frequency data defining a sequence of frequencies to which at least one of the first and second frequency synthesizers is to be programmed; and
   at least one counter having an input coupled to the timing source and an output coupled to the at least one frequency memory, for specifying a particular address of the frequency memory.

5. The automatic test system as recited in claim 4, wherein the dynamic controller includes a first dedicated portion corresponding to the first frequency synthesizer and a second dedicated portion corresponding to the second frequency synthesizer, each dedicated portion comprising a different frequency memory and counter.

6. The automatic test system as recited in claim 4, wherein the timing source comprises a programmable clock that generates a clock signal.

7. The automatic test system as recited in claim 4, wherein
   the timing source comprises a digital subsystem for generating accurately timed commands, and
   the dynamic controller further comprises a control circuit coupled to the digital subsystem for causing the dynamic controller to output a new value of frequency data from the at least one frequency memory in response to commands from the digital subsystem.

8. The automatic test system as recited in claim 7, wherein the measurement instrument has an input coupled to the digital subsystem for receiving commands from the digital subsystem that are synchronized with the commands received by the dynamic controller.

9. The automatic test system as recited in claim 7, further comprising:
   a second mixer disposed between the first synthesizer and the DUT, the second mixer having a first input, a second input, and an output, the first input of the second mixer coupled to the output of the first synthesizer and the output of the second mixer coupled to the input of the DUT; and
   an arbitrary waveform generator having an output coupled to the second input of the mixer,
   wherein the arbitrary waveform generator has an input coupled to the digital subsystem for receiving commands from the digital subsystem that are synchronized with the commands received by the dynamic controller.

10. The automatic test system as recited in claim 7, wherein the commands from the digital subsystem include any of a START command that initiates a frequency hopping sequence, a STOP command that terminates a frequency hopping sequence, and a HOP command that causes a frequency synthesizer to change to a new frequency.

11. In an automatic test system for testing a DUT (device under test) having an input and an output, wherein the automatic test system employs a frequency synthesizer coupled to the input of the DUT and a measurement instrument coupled to the output of the DUT, a method of testing a DUT comprising the steps of:

storing frequency data including a plurality of portions each specifying a frequency to which the frequency synthesizer is to be programmed;

selecting each of the portions of frequency data in a sequence, in response to timing control from a timing source;

for each portion of frequency data selected in the selecting step, releasing the portion of frequency data to the frequency synthesizer, so that the frequency synthesizer is caused to generate a signal having a frequency specified by the selected portion of frequency data; and for each portion of frequency data selected in the selecting step, measuring the signal at the output of the DUT using the measurement instrument.

12. The method of testing a DUT as recited in claim 11, wherein the automatic test system further includes a second frequency synthesizer coupled to the output of the DUT, and the method further comprises:

storing frequency data including a plurality of portions each specifying a frequency with which the second frequency synthesizer is to be programmed;

selecting each of the portions of frequency data for the second frequency synthesizer in a sequence, in response to timing control from a timing source; and for each portion of frequency data selected for the second frequency synthesizer, releasing the portion of frequency data to the second frequency synthesizer, so that the second frequency synthesizer is caused to generate a signal having a frequency specified by the selected portion of frequency data.

13. The method of testing a DUT as recited in claim 12, wherein the timing source is a digital subsystem, and each step of selecting comprises the digital subsystem generating at least one accurately timed command that instructs the test system to select each portion of frequency data.

14. The method of testing a DUT as recited in claim 13, wherein the digital subsystem is coupled to the measurement instrument for providing accurately timed commands that instruct the measurement instrument to measure the signal at the output of the DUT.

15. The method of testing a DUT as recited in claim 14, wherein the commands produced by the digital subsystem are included within test vectors issued at predetermined instants in time, and wherein the commands for the frequency synthesizers and the commands for the measurement instrument are generated in synchronization with each other.

16. A method of testing a DUT (device under test) that rapidly changes from one operating frequency to another, in an automatic test system that includes a digital subsystem that generates accurately timed commands, comprising the steps of:

(a) issuing a first command from the digital subsystem for programming a frequency synthesizer, to establish a first operating frequency of the DUT;

(b) issuing a second command from the digital subsystem for activating a measurement instrument to measure an output signal of the DUT;

(c) after a predetermined delay, issuing another command from the digital subsystem for again programming the frequency synthesizer, to establish another operating frequency of the DUT;

(d) issuing another command from the digital subsystem for again activating the measurement instrument to measure the output signal of the DUT; and (e) repeating steps (c) and (d) a predetermined number of times, to cause the DUT to assume different operating frequencies and to cause the measurement instrument to measure the output signal of the DUT at each operating frequency.

17. The method of testing a DUT as recited in claim 16, further comprising, prior to step (a), a step of storing a sequence of frequency data that defines a sequence of frequencies to which the frequency synthesizer is to be programmed.

18. The method of testing a DUT as recited in claim 16, wherein the measurement instrument is a digitizer, and further comprising reading results from the digitizer for determining whether the DUT passes or fails.

19. The method of testing a DUT as recited in claim 18, further comprising, for each operating frequency that the DUT is made to assume, performing at least one digital signal processing algorithm on the results from the digitizer.

20. The method of testing a DUT as recited in claim 18, further including, for each operating frequency that the DUT is made to assume, computing a power spectrum of the output signal of the DUT.

* * * * *